(12) United States Patent
Nagarajan et al.

(10) Patent No.: US 8,269,297 B2
(45) Date of Patent: Sep. 18, 2012

(54) PHOTODIODE ISOLATION IN A PHOTONIC INTEGRATED CIRCUIT

(75) Inventors: Radhakrishnan L. Nagarajan, Cupertino, CA (US); Andrew G. Dentai, Mountain View, CA (US); Scott Corzine, Sunnyvale, CA (US); Steven Nguyen, San Jose, CA (US); Vikrant Lal, Sunnyvale, CA (US); Jacco L. Pleumeekers, Mountain View, CA (US); Peter W. Evans, Mountain House, CA (US)

(73) Assignee: Infinera Corporation, Sunnyvale, CA (US)

( * ) Notice: Subject to any disclaimer, the term of this patent is extended or adjusted under 35 U.S.C. 154(b) by 125 days.

(21) Appl. No.: 12/646,558

(22) Filed: Dec. 23, 2009

(65) Prior Publication Data

US 2011/0147874 A1    Jun. 23, 2011

(51) Int. Cl.
*H01L 31/0232* (2006.01)

(52) U.S. Cl. ............... 257/432; 257/189; 257/E31.056

(58) Field of Classification Search ............ 257/432, 257/443, 461, 184, 189, E31.055, E31.056
See application file for complete search history.

(56) References Cited

U.S. PATENT DOCUMENTS

| 5,404,373 | A  | * | 4/1995 | Cheng ............... 372/50.124 |
| 7,009,210 | B2 | * | 3/2006 | Sarathy et al. ............... 257/98 |
| 2007/0158659 | A1 | * | 7/2007 | Bensce ............... 257/79 |

* cited by examiner

*Primary Examiner* — Matthew Reames
(74) *Attorney, Agent, or Firm* — David L. Soltz

(57) ABSTRACT

Consistent with the present disclosure, a current blocking layer is provided between output waveguides carrying light to be sensed by the photodiodes in a balanced photodetector, and the photodiodes themselves. Preferably, the photodiodes are provided above the waveguides and sense light through evanescently coupling with the waveguides. In addition, the current blocking layer may include alternating p and n-type conductivity layers, such that, between adjacent ones of such layers, a reverse biased pn-junction is formed. The pn-junctions, therefore, limit the amount of current flowing from one photodiode of the balanced detector to the other, thereby improving performance.

23 Claims, 8 Drawing Sheets

PHOTODIODE ISOLATION IN A PHOTONIC INTEGRATED CIRCUIT

BACKGROUND

Wavelength division multiplexed (WDM) optical communication systems are known in which multiple optical signals, each having a different wavelength, are combined onto a single optical fiber. Such systems typically include a laser associated with each wavelength, a modulator configured to modulate the output of the laser, and an optical combiner to combine each of the modulated outputs.

Conventionally, WDM systems have been constructed from discrete components. For example, the lasers, modulators and combiners have be packaged separately and provided on a printed circuit board. More recently, however, many WDM components have been integrated onto a single chip, also referred to a photonic integrated circuit (PIC).

In order to further increase the data rates associated with WDM systems, various modulation formats have been proposed for generating a modulated optical output. One such modulation format, known as polarization multiplexed differential quadrature phase-shift keying ("Pol Mux DQPSK"), can provide higher data rates than other modulation formats. In a Pol Mux DQPSK modulation scheme, light having a given wavelength and a first polarization, such as a transverse electric (TE) polarization, is modulated in accordance with a DQPSK format, and combined with DQPSK modulated light having that wavelength but a second polarization, such as a transverse mode (TM) polarization. The combined light is then transmitted as an optical signal, along with other optical signals at different wavelengths, to an optical receiver node.

At the receiver node, the received optical is subject to known optical processing with components, such as an optical demultiplexer, 90 degree optical hybrid circuitry, and balanced photodetectors. In one example, the 90 degree optical hybrid circuitry may include a multi-mode interference (MMI) coupler, which has output waveguides that feed light directly to a pair of photodiodes that constitute the balanced photodetector. Efforts have been made to integrate the above-noted receiver node components onto a PIC.

Typically, the photodiodes included in the balanced photodetector include several semiconductor layers, one of which may be provided in contact with the output waveguides of the MMI coupler so that light output from the MMI coupler evanescently couples into the photodiodes. The waveguides which constitute the inputs and outputs of the MMI coupler, as well as the MMI coupler itself, may include one or more first semiconductor materials, while the photodiodes in the balanced photodetector may include one or more second semiconductor materials. Although the waveguides of the MMI coupler may not be doped, such waveguides may nevertheless have some conductivity. Thus, the MMI coupler waveguides may form an electrical path connecting the first and second photodiodes of the balanced photodetector pair, such that a current may flow between the first to the second photodiodes of the balanced photodetector pair, and the photodiodes may not properly sense incoming light.

SUMMARY

Consistent with an aspect of the present disclosure, an apparatus is provided that includes a waveguide. The waveguide has an input portion and first and second output portions. The input portion is configured to receive an optical signal, and the first and second output portions supply first and second portions of the optical signal, respectively. A first photodiode is also provided that is configured to receive the first portion of the optical signal, and a second photodiode is provided that is configured to receive the second portion of the optical signal. Moreover, first and second doped semiconductor layers are provided, and an interface between the first and second doped semiconductor layers constitutes a first pn-junction. The first and second doped semiconductor layers are provided between the first photodiode and the first output portion of the waveguide. In addition, third and fourth doped semiconductor layers are provided, and an interface between the third and fourth doped semiconductor layers constitutes a second pn-junction. The third and fourth doped semiconductor layers are provided between the second photodiode and the second output portion of the waveguide. Further, the first and second photodiodes are configured to be reversed biased and the first pn-junction is configured to be biased such that the first pn-junction is included in a first depletion region, and the second pn-junction is configured to be biased such that the second pn-junction is included in a second depletion region.

It is to be understood that both the foregoing general description and the following detailed description are exemplary and explanatory only and are not restrictive of the invention, as claimed.

The accompanying drawings, which are incorporated in and constitute a part of this specification, illustrate various embodiments consistent with aspects of this disclosure.

DESCRIPTION OF THE EMBODIMENTS

Consistent with the present disclosure, a current blocking layer is provided between output waveguides carrying light to be sensed by the photodiodes in a balanced photodetector and the photodiodes themselves. Preferably, the photodiodes are provided above the waveguides and sense light through evanescently coupling with the waveguides. In addition, the current blocking layer may include alternating p and n-type conductivity layers, such that, between adjacent ones of such layers, a reverse biased pn-junction is formed. The pn-junctions, therefore, limit the amount of current flowing from one photodiode of the balanced detector to the other, thereby improving performance.

Reference will now be made in detail to the following embodiments, examples of which are illustrated in the accompanying drawings. Wherever possible, the same reference numbers will be used throughout the drawings to refer to the same or like parts.

Figure 1:
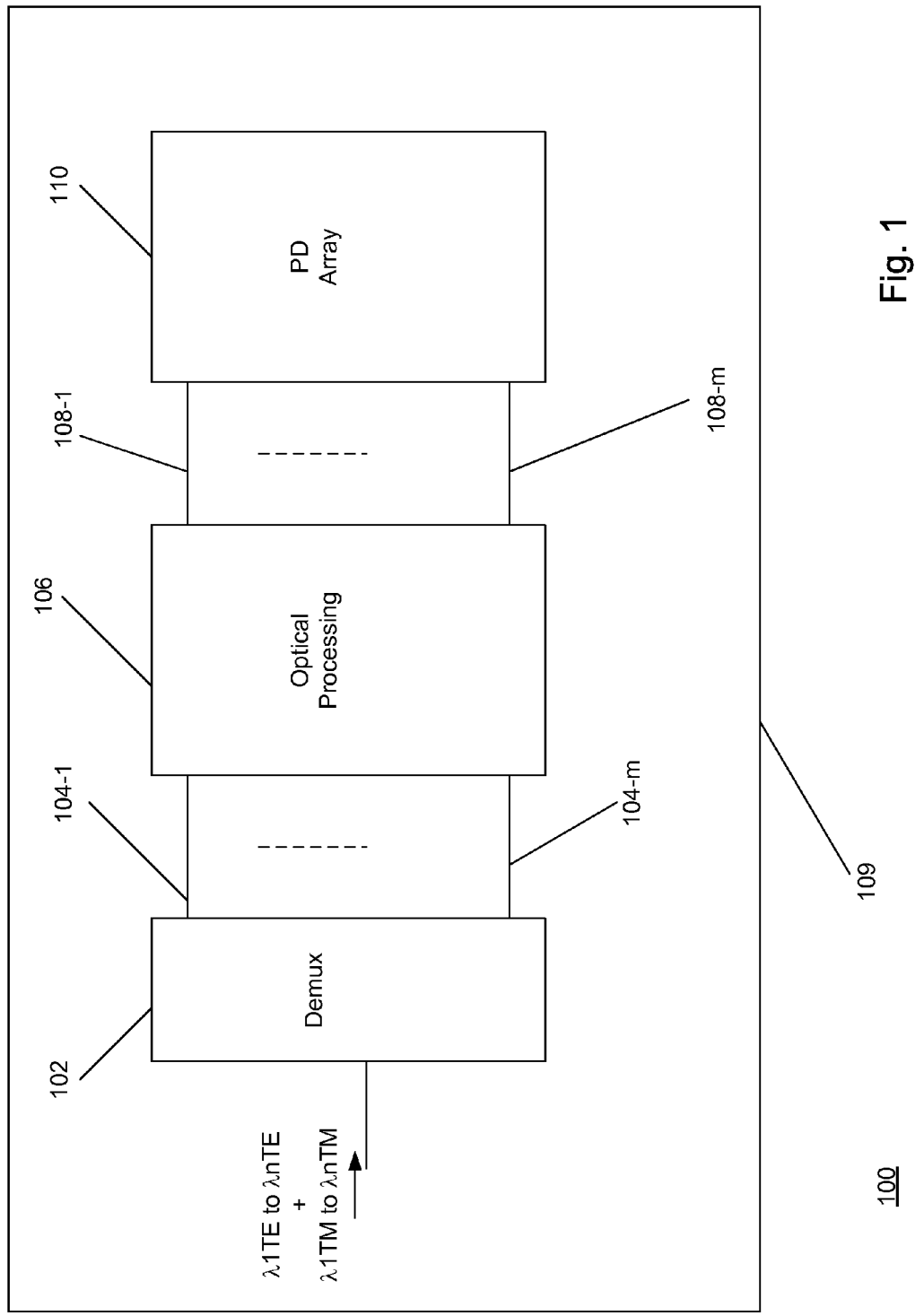
FIG. 1 illustrates a photonic integrated circuit (PIC) consistent with an aspect of the present disclosure.

FIG. 1 illustrates a block diagram of a PIC 100 consistent with an aspect of the present disclosure. PIC 100 may receive a plurality of optical signals λ1 to λn, each of which having a corresponding one of a plurality of wavelengths, and each including light having a first polarization (e.g., a TE polarization) and light having a second polarization (e.g., a TM polarization). The optical signals may conform to a DQPSK modulation format and are fed to demultiplexer 102, which has a plurality of outputs 104-1 to 104-*m*, each of which supplying a polarization component (either TE or TM) of a corresponding one of the plurality of optical signals. Demultiplexer 102 may also be a wavelength demultiplexer that separates and outputs multiplexed optical signals having different wavelengths. Outputs 104-1 to 104-*m*, in turn, supply light to optical processing circuitry 106, which may include, for example, 90 degree optical hybrid circuits including multimode interference (MMI) couplers. Optical processing circuitry 106 may, for example, change the phase of light input thereto consistent with known demodulation techniques for sensing DQPSK optical signals. Light is output from optical processing circuitry 106 on outputs 108-1 to 108-*m*, which supply such light to photodiode array 110.

As further shown in FIG. 1, demultiplexer 102, outputs 104-1 to 104-*m*, optical processing circuit 106, outputs 108-1 to 108-*m*, and photodiode array 110 are provided on substrate 109, which may be a semi-insulating (SI) indium phosphide (InP) substrate, for example.

Figure 2:
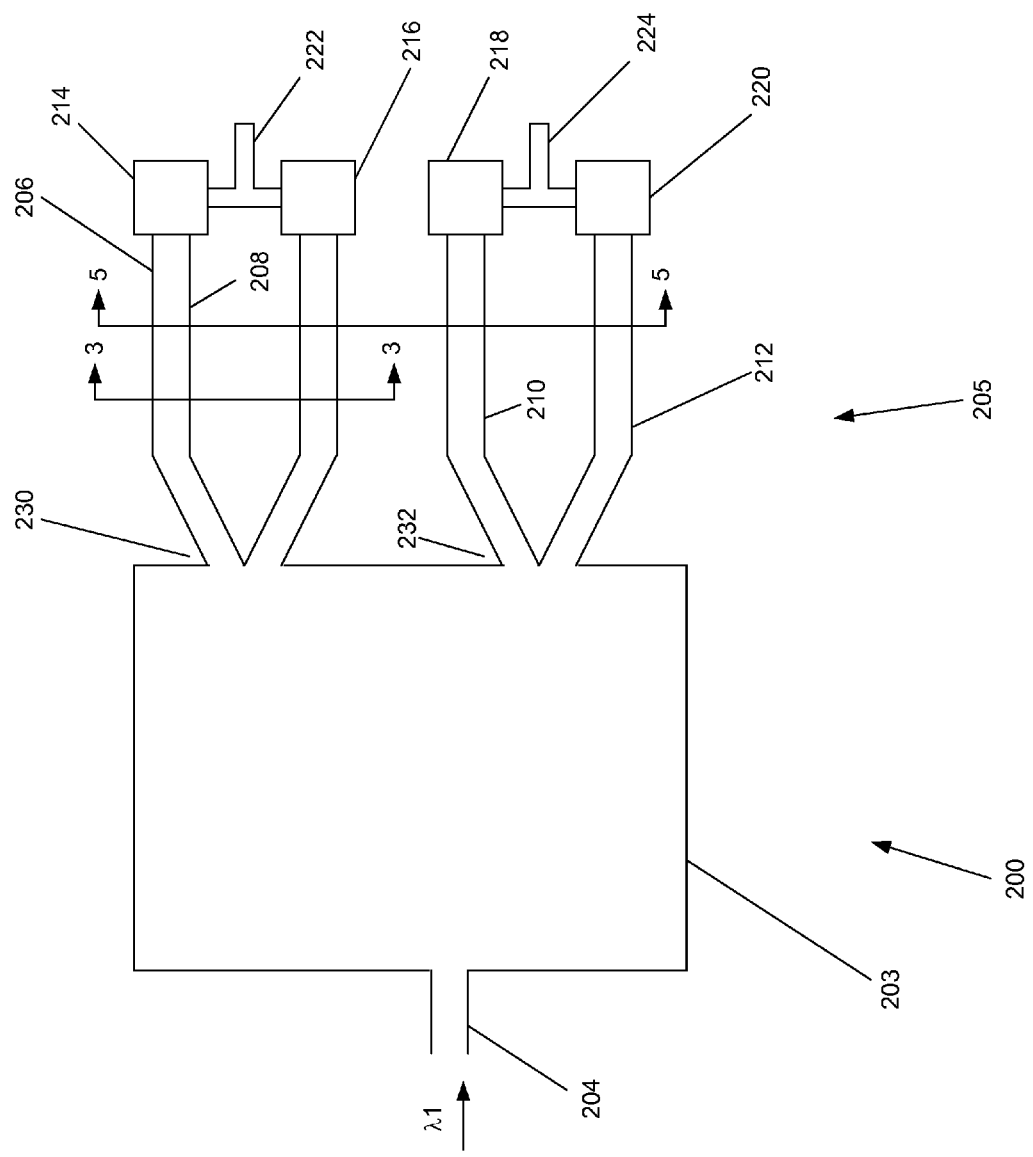
FIG. 2 illustrates a plan view of a portion of the PIC shown in FIG. 1.

FIG. 2 illustrates a portion 200 of optical processing circuit 106 and a portion 205 of photodiode array 110 in greater detail. Portion 200 includes a waveguide 202 including input portion 204 that receives light or an optical signal having wavelength λ1 and an MMI coupler 203, which operates in a known manner to supply first, second, third, and fourth portions of the incoming optical signal to output waveguide portions 206, 208, 210, and 212, respectively. Typically, output portions 206 and 208 may be joined at location 230 and output portions 210 and 212 may be joined at location 232. Each of a first pair of photodiodes (not shown in FIG. 2) that constitute a first balanced photodetector may be provided on a corresponding one of output portions 206 and 208, and each of a second pair of photodiodes that constitute a second balanced photodetector may be provided on a corresponding one of output portions 210 and 212. As further shown in FIG. 2, conductive pads 214, 216, 210, and 220 may be provided to supply an electrical connection to the photodiodes. In addition, conductors 222 and 224 may provide output electrical signals for further processing by, for example, a transimpedance amplifier (not shown).

Figure 3:
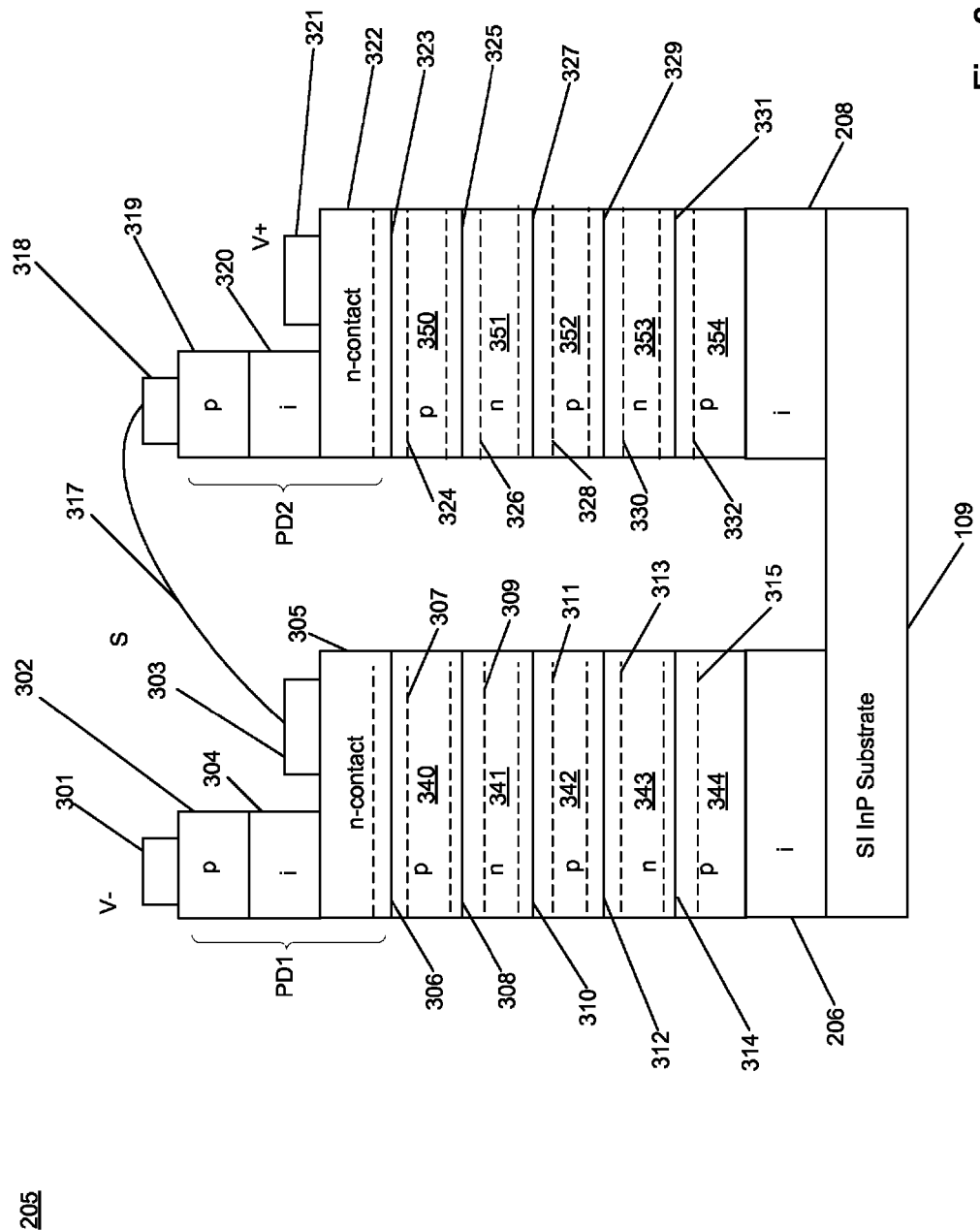
FIG. 3 illustrates a cross-sectional view taken along line 3-3 in FIG. 2.

FIG. 3 illustrates a cross-sectional view of part of photodiode array portion 205. FIG. 3 is taken along line 3-3 in FIG. 2. Portion 205 may include a pair of PIN photodiodes PD1 and PD1, for example. Photodiode PD1 includes p-type layer 302, intrinsic (I) layer 304, and an n-type contact semiconductor layer 305. Conductive contact 301 provides an electrical connection to p-type layer 302 and may be connected to pad 214 shown in FIG. 2. In addition, conductive contact 303 provides an electrical connection to n-type layer 305 and may be connected to conductor 222 shown in FIG. 2.

Photodiode PD2 includes p-type layer 319, intrinsic (I) layer 320, and an n-type contact semiconductor layer 322. Conductive contact 318 provides an electrical connection to p-type layer 319 and may be connected (via conductor 317) to conductor 222 shown in FIG. 2. Conductor 317 supplies a signal voltage S to conductor 222 indicative of light sensed by photodiodes PD1 and PD2. In addition, conductive contact 321 provides an electrical connection to n-type layer 322.

As further shown in FIG. 3, a first plurality of alternating conductivity type semiconductor layers 340-344 are provided between photodiode PD1 and output waveguide portion 206, and a second plurality of alternating conductivity type semiconductor layers 350-354 are provided between photodiode PD1 and output waveguide portion 208. Interfaces 306, 308, 312, and 314 are provided between respective adjacent ones of semiconductor layers 340 to 344, and interfaces 324, 326, 328, 330, and 332 are provided between respective adjacent ones of semiconductor layers 350 to 354. As shown in FIG. 3, p-type layer 302 of PD1 is preferably maintained at a relatively low or negative potential V−, and n-type layer 322 of photodiode 322 is maintained at a relatively high or positive potential V+. Accordingly, photodiodes PD1 and PD2 may be reverse biased.

It is understood that a current blocking layer consistent with the present invention need not be limited to the number of alternating p and n-type layer discussed above. Rather, any appropriate number of such layers is contemplated herein. For example, one p-type layer and one n-type layer (e.g., layers 340 and 341) could be included to provide pn-junctions at interface 306 and 308 only. Moreover, the present disclosure is not limited to PIN photodiodes, but other photodiodes or light sensing devices may be provided instead.

As noted above, output waveguide portions 206 and 208 are undoped and are thus intrinsic, but still have some conductivity. Since output waveguide portions 206 and 208 are joined at locations 230 and 232 (see FIG. 2), an electrical path or current path may be formed that electrically connects waveguide portion 206 to waveguide portion 208. With the above noted biases of V+, V−, and the signal voltage S applied to conductors 321, 301, and 317, respectively, however, each of interfaces 306, 308, 310, 312, and 314 constitutes a reverse biased pn-junction that limits or blocks current flow, for example, from output portion 206 to photodiode PD1. Moreover, such reverse biasing may form depletion regions 307, 309, 311, 313, and 315, which include a corresponding one of interfaces 306, 308, 310, 312, and 314. In addition, interfaces 323, 325, 327, 329, and 331 also form corresponding current limiting/blocking reverse biased pn-junctions, which are included in resulting depletion regions 324, 326, 328, 330, and 332.

Accordingly, since current flow may be substantially blocked between photodiodes PD1 and PD2, these photodiodes can more accurately sense the light supplied thereto.

Figure 4:
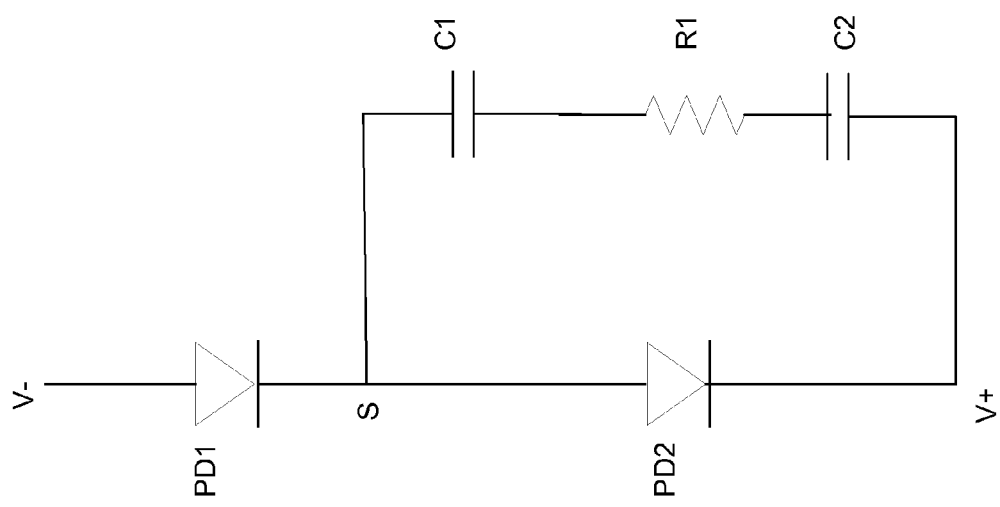
FIG. 4 illustrates an equivalent circuit of the features shown in FIG. 3.

FIG. 4 illustrates an equivalent circuit of the features shown in FIG. 3. Namely, the photodiodes are connected, such that the anode of photodiode PD1 is coupled to bias V−. In addition, the cathode of photodiode PD1 is coupled to the anode of photodiode PD2, and such connection varies with signal voltage S. The cathode of photodiode PD2 is maintained at potential V+.

As further shown in FIG. 4, interfaces or pn-junctions 306, 308, 310, 312, and 314 have a collective capacitance represented by capacitor C1 in FIG. 4, and interfaces or pn-junctions 323, 325, 327, 329, and 331 have a collective capacitance represented by capacitor C2. Although a resistive current path may form between output waveguide portions 206 and 208, as represented by resistor R1, the resistive current path is isolated by capacitors C1 and C2 so that no or substantially little direct current (DC) will flow to either photodiode PD1 or photodiode PD2.

Figure 5:
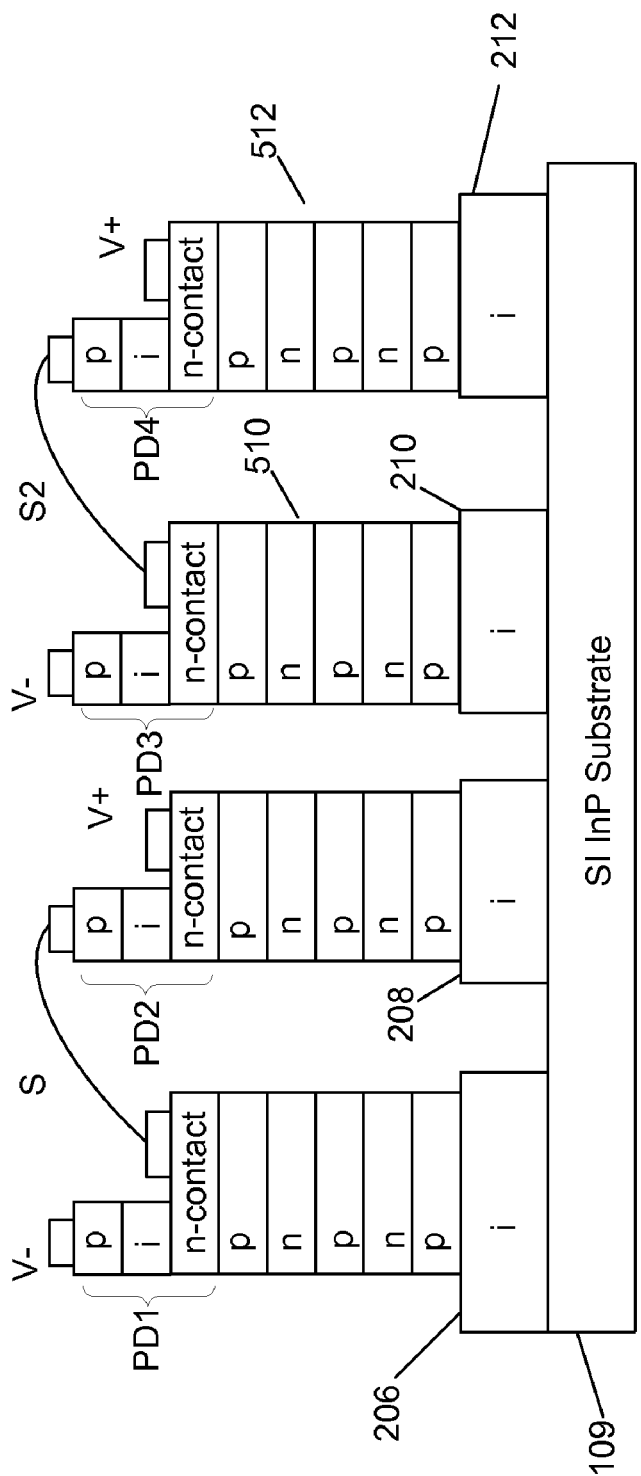
FIG. 5 illustrates a cross-sectional view taken along line 5-5 in FIG. 2.

FIG. 5 illustrates a cross-sectional view of photodiode array portion 205 taken along line 5-5 in FIG. 2. Photodiodes PD1 and PD2 are discussed above and, for convenience, will not be described in detail in connection with FIG. 5. As shown in FIG. 5, additional PIN photodiodes PD3 and PD4 may be provided to sense light through evanescent coupling from waveguide output portions 210 and 212 (see FIG. 2). Photodiodes PD3 and PD4 may have a structure similar to that of photodiodes PD1 and PD2. In a similar manner to that discussed above, alternating p and n-type semiconductor layers 510 may be provided between photodiode PD3 and intrinsic or undoped output waveguide portion 210, and alternating p and n-type semiconductor layers 512 are provided between photodiode PD4 and intrinsic or undoped output waveguide portion 212. Layers 510 and 512 include pluralities of interfaces or pn-junctions that are reverse biased by voltages V−, V+ and S2 (a signal voltage supplied similar to signal voltage S discussed above), to yield depletion regions, similar to those discussed above, that encompass or include the pn-junctions. Accordingly, semiconductor layers 510 and 512 serve to electrically isolate PD3 and PD4 from a current path coupling output waveguide portions 210 and 212, which are joined to one another at location 232.

Figure 6:
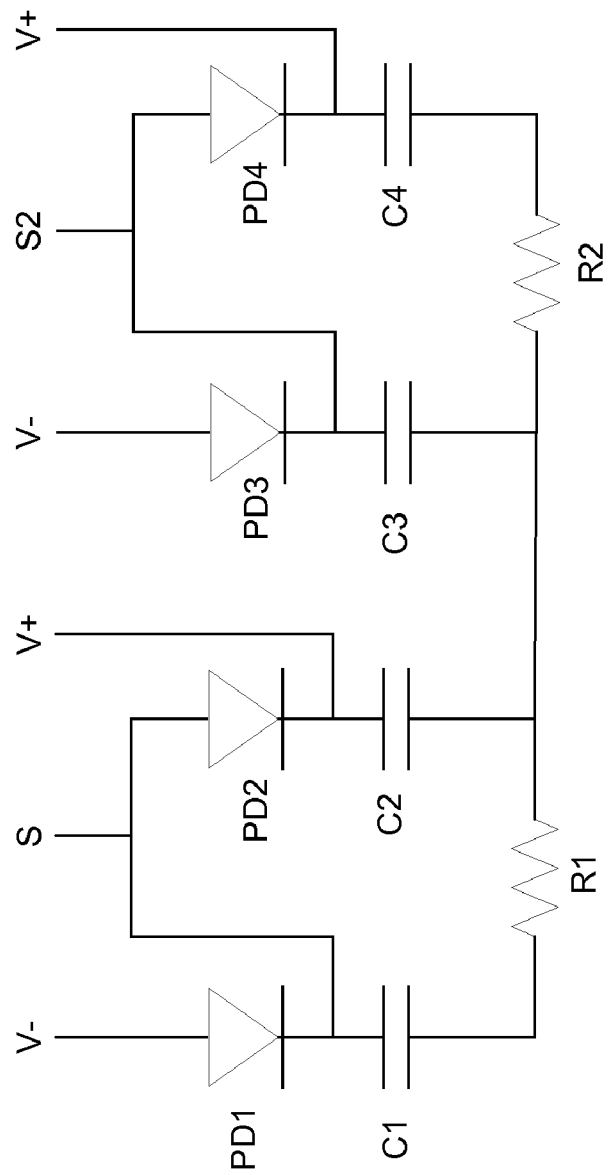
FIG. 6 illustrates an equivalent circuit of the features shown in FIG. 5.

FIG. 6 illustrates an equivalent circuit of the features shown in FIG. 5. Namely, capacitors C3 and C4 in FIG. 6 corresponds to the effective capacitance associated with semiconductor layers 510 and 512, respectively, and resistance R2 corresponds to the resistive current path between output waveguide portions 210 and 212. Capacitances C3 and C4 act to isolate photodiodes PD3 and PD4 from DC current that may flow in a current path between waveguide portions 210 and 212 (resistance R2). Moreover, each of capacitances C1, C2, C3, and C4 may effectively provide electrical isolation for a corresponding one of photodiodes PD1 to PD4, as noted above.

Preferably, the thicknesses of each of the current blocking semiconductor layers discussed above should also be optimized to facilitate evanescent coupling between photodiodes PD1 to PD4 and the corresponding output waveguide portions, so that light supplied by the output waveguide portions may be adequately sensed or detected by these photodiodes. The total number of blocking junctions should not be too numerous to improve blocking efficiency, because that will negatively impact the ability of the optical mode to evanescently couple to the photodiode.

Figure 7:
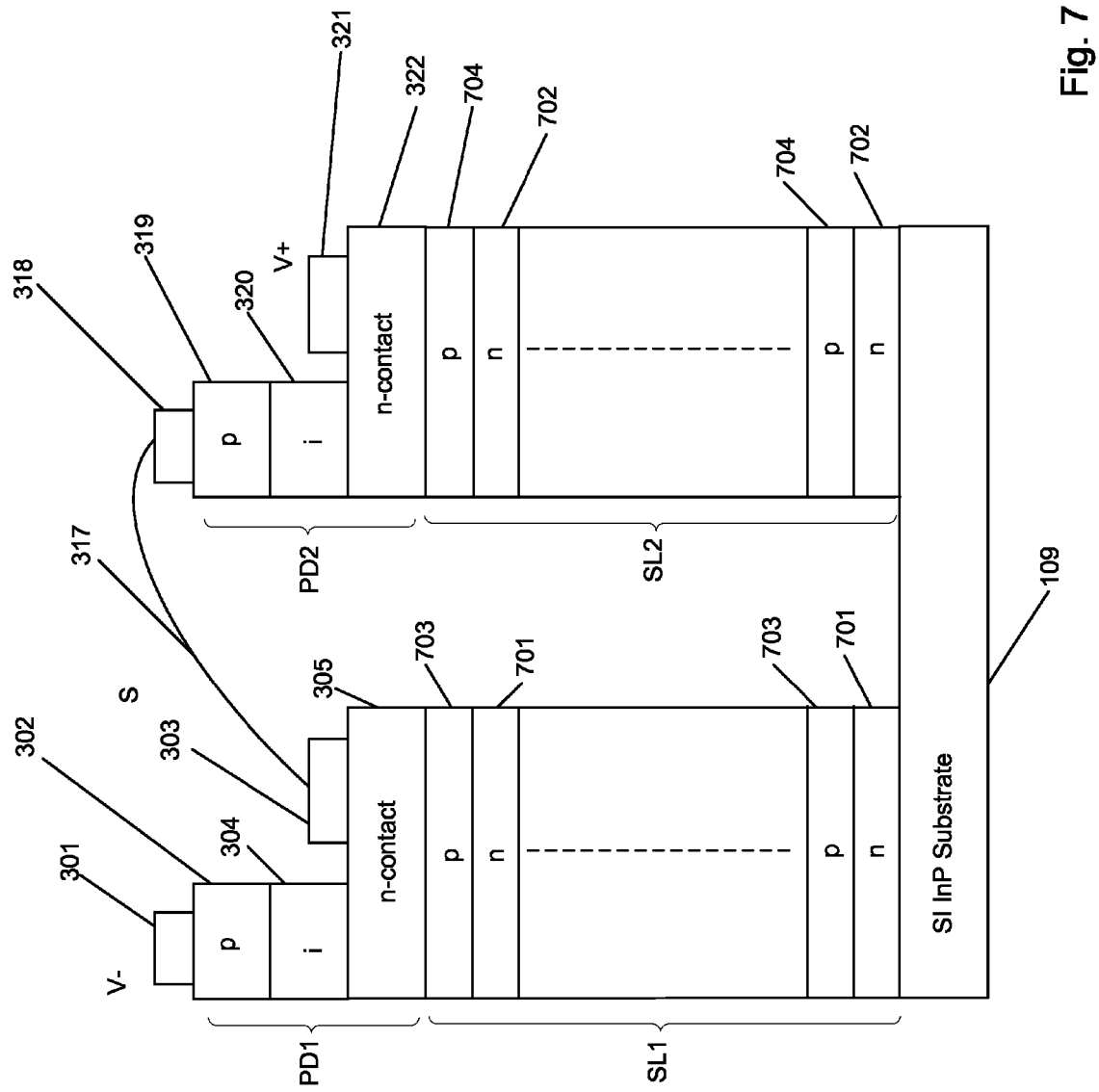
FIG. 7 illustrates an example in which a blocking layer includes a super lattice structure.
Figure 8:
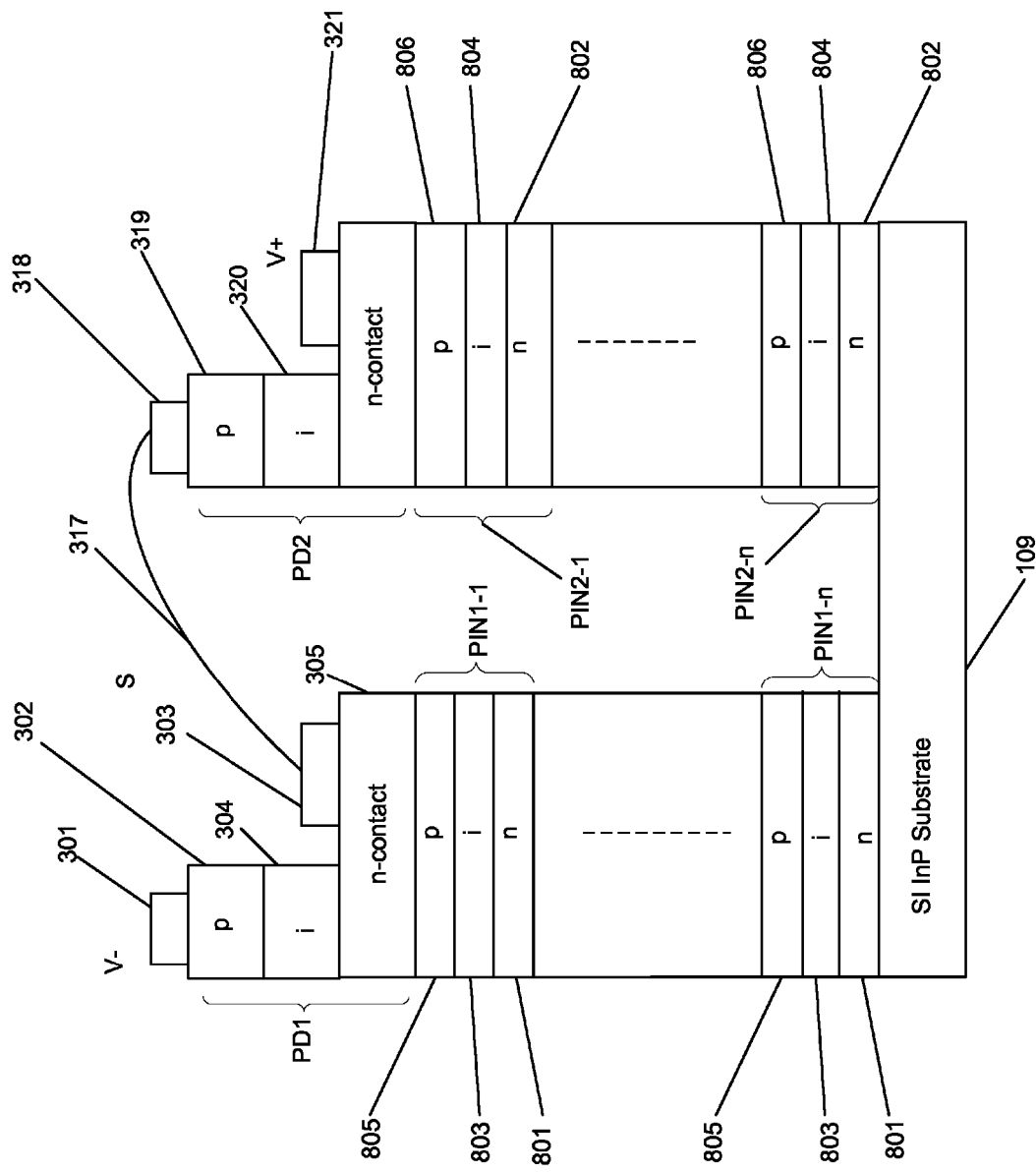
FIG. 8 illustrates an example in which the blocking layer includes a plurality of PIN photodiodes.

As noted above, portion 205 of photodiode array 110 includes a plurality of p-n junctions that block current that may flow from photodiode PD1 to photodiode PD2 (see junctions 308, 310, 312, and 314 in FIG. 3). Consistent with a further aspect of the present disclosure, such p-n junctions may be replaced with a plurality of p-i(intrinsic)-n diodes to achieve similar current blocking. For example, as shown in FIG. 8, a plurality of pin photodiodes PIN1-1 to PIN1-n, each of which including layers p(805), i(803), and n(801) may be provided between n-contact layer 305 and substrate 109. In addition, a plurality of pin photodiodes PIN2-1 to PIN2-n, each of which including layers p(806), i(804), and n(802) may be provided between n-contact layer 322 and substrate 109. Alternatively, the current blocking p-n junctions shown in FIG. 3 may be replaced by a superlattice structure including relatively thin p and n-type alternating layers forming either homojunctions, in which both the p and n-type materials are the same (e.g., InP or InAlGaAs) or heterojunctions, in which the p-type layer may include a material different than the n-type layer. For example, as shown in FIG. 7, superlattices SL1 and SL2 may be provided beneath photodiodes PD1 and PD2, respectively. Superlattice SL1 may include alternating p (703) and n (701) layers, and superlattice SL2 may similarly include alternating p (704) and n(702) layers. Layers 703 and 704 may include AlInAs (doped with zinc) and layers 701 and 702 may include InP (doped with Si). Substrate 109 may be semi-insulating, as noted above, and may include iron-doped InP. In one example, current blocking layers similar to that shown in FIG. 7 reduced current flow between the photodiodes by three orders of magnitude compared to a photonic integrated circuit including trench-isolated photodiodes.

In addition, junctions 308, 310, 312, and 314 shown in FIG. 3 may be either homojunctions (e.g., layers 340 to 344 include the same material, e.g., InP) or heterojunctions (e.g. layers 340, 342, and 344 are the same, but layers 343 and 341 are different). Examples of materials which may be included in layers 340-344 and 350-354 include alternating layers of InAlAs and InGaAs; InGaAlAs and InGaAsP; AlInAs and InP; and InGaAsP and InP.

Preferably, the current blocking layers include an aluminum containing quarternary semiconductor alloy. If these layers include a phosphorus containing quarternary semiconductor alloy, increased leakage current may be observed after a passivation layer is deposited thereon (on the sidewalls). Other portions of PD array 110, however, may include such phosphorus containing quarternary semiconductor alloy and adequate blocking may be obtained.

Other embodiments of the invention will be apparent to those skilled in the art from consideration of the specification and practice of the invention disclosed herein. For example, as noted above, light may be evanescently coupled to the photodiodes. Consistent with a further aspect of the present disclosure, however, the photodiodes may be butt coupled to the waveguides carrying the optical signals. It is intended that the specification and examples be considered as exemplary only, with a true scope and spirit of the invention being indicated by the following claims.

What is claimed is:

1. An apparatus, comprising:
   a waveguide having an input portion and first and second output portions, the input portion being configured to receive an optical signal, and the first and second output portions supplying first and second portions of the optical signal, respectively;
   a first photodiode configured to receive the first portion of the optical signal;
   a second photodiode configured to receive the second portion of the optical signal;
   first and second doped semiconductor layers, an interface between the first and second doped semiconductor layers constituting a first pn-junction, the first and second doped semiconductor layers being provided between the first photodiode and the first output portion of the waveguide;
   third and fourth doped semiconductor layers, an interface between the third and fourth doped semiconductor layers constituting a second pn-junction, the third and fourth doped semiconductor layers being provided between the second photodiode and the second output portion of the waveguide, wherein the first and second photodiodes are configured to be reversed biased and the first pn-junction is configured to be biased such that the first pn-junction is included in a first depletion region, and the second pn-junction is configured to be biased such that the second pn-junction is included in a second depletion region,
   wherein the first, second, third and fourth semiconductor layers include an aluminum containing quarternary semiconductor alloy and do not include a phosphorus containing quarternary semiconductor alloy.

2. An apparatus in accordance with claim 1, wherein the first and second photodiodes include first and second PIN photodiodes, respectively.

3. An apparatus in accordance with claim 1, wherein the first and third doped semiconductor layers having an n-conductivity type and the second and fourth semiconductor layers have a p-conductivity type.

4. An apparatus in accordance with claim 1, further including:
fifth and sixth doped semiconductor layers, an interface between the fifth and sixth doped semiconductor layers constituting a third pn-junction, the fifth and sixth doped semiconductor layers being provided between the first pn-junction and the first output portion of the waveguide.

5. An apparatus in accordance with claim 1, wherein the waveguide includes a multi-mode interference (MMI) coupler.

6. An apparatus in accordance with claim 1, wherein the waveguide includes an undoped semiconductor layer, the apparatus further including a substrate, the waveguide being provided on the substrate.

7. An apparatus in accordance with claim 6, wherein the substrate includes semi-insulating indium phosphide (InP).

8. An apparatus in accordance with claim 1, wherein the waveguide further includes third and fourth output portions, which supply third and fourth portions of the optical signal, respectively, the apparatus further including:
a third photodiode configured to receive the third portion of the optical signal;
a fourth photodiode configured to receive the fourth portion of the optical signal;
fifth and sixth doped semiconductor layers, an interface between the fifth and sixth doped semiconductor layers constituting a third pn-junction, the fifth and sixth doped semiconductor layers being provided between the third photodiode and the third output portion of the waveguide;
seventh and eighth doped semiconductor layers, an interface between the seventh and eighth doped semiconductor layers constituting a fourth pn-junction, the seventh and eighth doped semiconductor layers being provided between the fourth photodiode and the fourth output portion of the waveguide, wherein the third and fourth photodiodes are configured to be reversed biased and the third pn-junction is configured to be biased such that the first pn-junction is included in a third depletion region, and the fourth pn-junction is configured to be biased such that the fourth pn-junction is included in a fourth depletion region.

9. An apparatus in accordance with claim 8, wherein the third and fourth photodiodes include third and fourth PIN photodiodes, respectively.

10. An apparatus in accordance with claim 8, wherein the fifth and seventh doped semiconductor layers having an n-conductivity type and the sixth and eighth semiconductor layers have a p-conductivity type.

11. An apparatus, comprising:
an optical demultiplexer configured to receive a plurality of optical signals, each of which having a corresponding one of a plurality of wavelength, the optical demultiplexer having a plurality of outputs, each of which supplying a corresponding one of the plurality of optical signals;
a waveguide having an input portion and first and second output portions, the input portion being configured to receive one of the plurality of optical signals, and the first and second output portions supplying first and second portions of said one of the plurality of optical signals, respectively;
a first photodiode configured to receive the first portion of said one of the plurality of optical signals;
a second photodiode configured to receive the second portion of said one of the plurality of optical signals;
first and second doped semiconductor layers, an interface between the first and second doped semiconductor layers constituting a first pn-junction, the first and second doped semiconductor layers being provided between the first photodiode and the first output portion of the waveguide;
third and fourth doped semiconductor layers, an interface between the third and fourth doped semiconductor layers constituting a second pn-junction, the third and fourth doped semiconductor layers being provided between the second photodiode and the second output portion of the waveguide, wherein the first and second photodiodes are configured to be reversed biased and the first pn-junction is configured to be biased such that the first pn-junction is included in a first depletion region, and the second pn-junction is configured to be biased such that the second pn-junction is included in a second depletion region,
wherein the first, second, third and fourth semiconductor layers include an aluminum containing quartenary semiconductor alloy and do not include a phosphorus containing quartenary semiconductor alloy.

12. An apparatus in accordance with claim 11, wherein the first and second photodiodes include first and second PIN photodiodes, respectively.

13. An apparatus in accordance with claim 11, wherein the first and third doped semiconductor layers having an n-conductivity type and the second and fourth semiconductor layers have a p-conductivity type.

14. An apparatus in accordance with claim 11, further including:
fifth and sixth doped semiconductor layers, an interface between the fifth and sixth doped semiconductor layers constituting a third pn-junction, the fifth and sixth doped semiconductor layers being provided between the first pn-junction and the first output portion of the waveguide.

15. An apparatus in accordance with claim 11, wherein the waveguide includes a multi-mode interference (MMI) coupler.

16. An apparatus in accordance with claim 11, wherein the waveguide includes an undoped semiconductor layer, the apparatus further including a substrate, waveguide being provided on the substrate.

17. An apparatus in accordance with claim 16, wherein the substrate includes semi-insulating indium phosphide (InP).

18. An apparatus in accordance with claim 11, wherein the waveguide further includes third and fourth output portions, which supply third and fourth portions of said one of the plurality of optical signals, respectively, the apparatus further including:
a third photodiode configured to receive the third portion of said one of the plurality of optical signals;
a fourth photodiode configured to receive the fourth portion of said one of the plurality of optical signals;
fifth and sixth doped semiconductor layers, an interface between the fifth and sixth doped semiconductor layers constituting a third pn-junction, the fifth and sixth doped semiconductor layers being provided between the third photodiode and the third output portion of the waveguide;
seventh and eighth doped semiconductor layers, an interface between the seventh and eighth doped semiconductor layers constituting a fourth pn-junction, the seventh and eighth doped semiconductor layers being provided between the fourth photodiode and the fourth output portion of the waveguide, wherein the third and fourth photodiodes are configured to be reversed biased and the third pn-junction is configured to be biased such that the first pn-junction is included in a third depletion region, and the fourth pn-junction is configured to be biased such that the fourth pn-junction is included in a fourth depletion region.

19. An apparatus in accordance with claim 18, wherein the third and fourth photodiodes include third and fourth PIN photodiodes, respectively.

20. An apparatus in accordance with claim 18, wherein the fifth and seventh doped semiconductor layers having an n-conductivity type and the sixth and eighth semiconductor layers have a p-conductivity type.

21. An apparatus, comprising:
   a waveguide having an input portion and first and second output portions, the input portion being configured to receive an optical signal, and the first and second output portions supplying first and second portions of the optical signal, respectively;
   a first photodiode configured to receive the first portion of the optical signal;
   a second photodiode configured to receive the second portion of the optical signal;
   first, second, and third semiconductor layers constituting first pin layers, the first pin layers being provided between the first photodiode and the first output portion of the waveguide;
   fourth, fifth, and sixth semiconductor layers constituting second pin layers, the second pin layers being provided between the second photodiode and the second output portion of the waveguide, wherein the first and second photodiodes are configured to be reversed biased,
   wherein the first, second, third, fourth, fifth, and sixth semiconductor layers include an aluminum containing quartenary semiconductor alloy and do not include a phosphorus containing quartenary semiconductor alloy.

22. An apparatus in accordance with claim 1, wherein the interface between the first and second semiconductor layers is a heterojunction.

23. An apparatus in accordance with claim 1, wherein the interface between the first and second semiconductor layers is a homojunction.

* * * * *